US010544509B2

(12) United States Patent
Shirahata et al.

(10) Patent No.: US 10,544,509 B2
(45) Date of Patent: Jan. 28, 2020

(54) FILM FORMING DEVICE

(71) Applicant: TOSHIBA MITSUBISHI-ELECTRIC INDUSTRIAL SYSTEMS CORPORATION, Tokyo (JP)

(72) Inventors: Takahiro Shirahata, Tokyo (JP); Hiroyuki Orita, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 0 days.

(21) Appl. No.: 15/761,613

(22) PCT Filed: Oct. 19, 2015

(86) PCT No.: PCT/JP2015/079448
§ 371 (c)(1),
(2) Date: Mar. 20, 2018

(87) PCT Pub. No.: WO2017/068625
PCT Pub. Date: Apr. 27, 2017

(65) Prior Publication Data
US 2018/0347050 A1    Dec. 6, 2018

(51) Int. Cl.
*C23C 18/16* (2006.01)
*B05C 5/02* (2006.01)

(52) U.S. Cl.
CPC ............ *C23C 18/16* (2013.01); *B05C 5/027* (2013.01)

(58) Field of Classification Search
USPC .............................. 118/313–315, 62, 63, 715
See application file for complete search history.

(56) References Cited

U.S. PATENT DOCUMENTS

| 4,891,249 A * | 1/1990 | McIntyre ............... B05B 7/0475 |
| | | 118/315 |
| 10,016,785 B2 * | 7/2018 | Orita ....................... C23C 16/18 |
| 2013/0247820 A1 | 9/2013 | Orita et al. |

(Continued)

FOREIGN PATENT DOCUMENTS

| TW | 201311363 A1 | 3/2013 |
| TW | 201418894 A | 5/2014 |

(Continued)

OTHER PUBLICATIONS

Office Action dated Sep. 4, 2018 in Japanese Patent Application No. 2017-546291, with unedited computer generated English translation.

(Continued)

*Primary Examiner* — Yewebdar T Tadesse
(74) *Attorney, Agent, or Firm* — Oblon, McClelland, Maier & Neustadt, L.L.P.

(57) ABSTRACT

In a film forming device, a mist spray head includes: an inert gas spray part between a raw material solution spray nozzle and a reaction material spray nozzle; and an inert gas spray part between the raw material solution spray nozzle and a reaction material spray nozzle. Accordingly, an inert gas ejection port is provided between a raw material solution ejection port and a reaction material ejection port, and an inert gas ejection port is provided between the raw material solution ejection port and a reaction material ejection port.

15 Claims, 7 Drawing Sheets

(56) References Cited

U.S. PATENT DOCUMENTS

2014/0141170 A1    5/2014  Orita et al.
2015/0299854 A1*  10/2015  Shirahata ............. B05B 7/0012
                                                  118/719

FOREIGN PATENT DOCUMENTS

WO    2012/124047 A1    9/2012
WO    2013/038484 A1    3/2013

OTHER PUBLICATIONS

Japanese Office Action dated Jan. 22, 2019 in Japanese Patent Application No. 2017-546291 (with unedited computer generated English translation), 8 pages.
Office Action dated Aug. 25, 2016 in Taiwanese Patent Application No. 105105868 (With Partial English Translation).
International Search Report dated Jan. 12, 2016 in PCT/JP2015/079448 filed Oct. 19, 2015.
International Preliminary Report on Patentability and Written Opinion dated May 3, 2018 in PCT/JP2015/079448 (with English translation).

* cited by examiner

F I G . 1
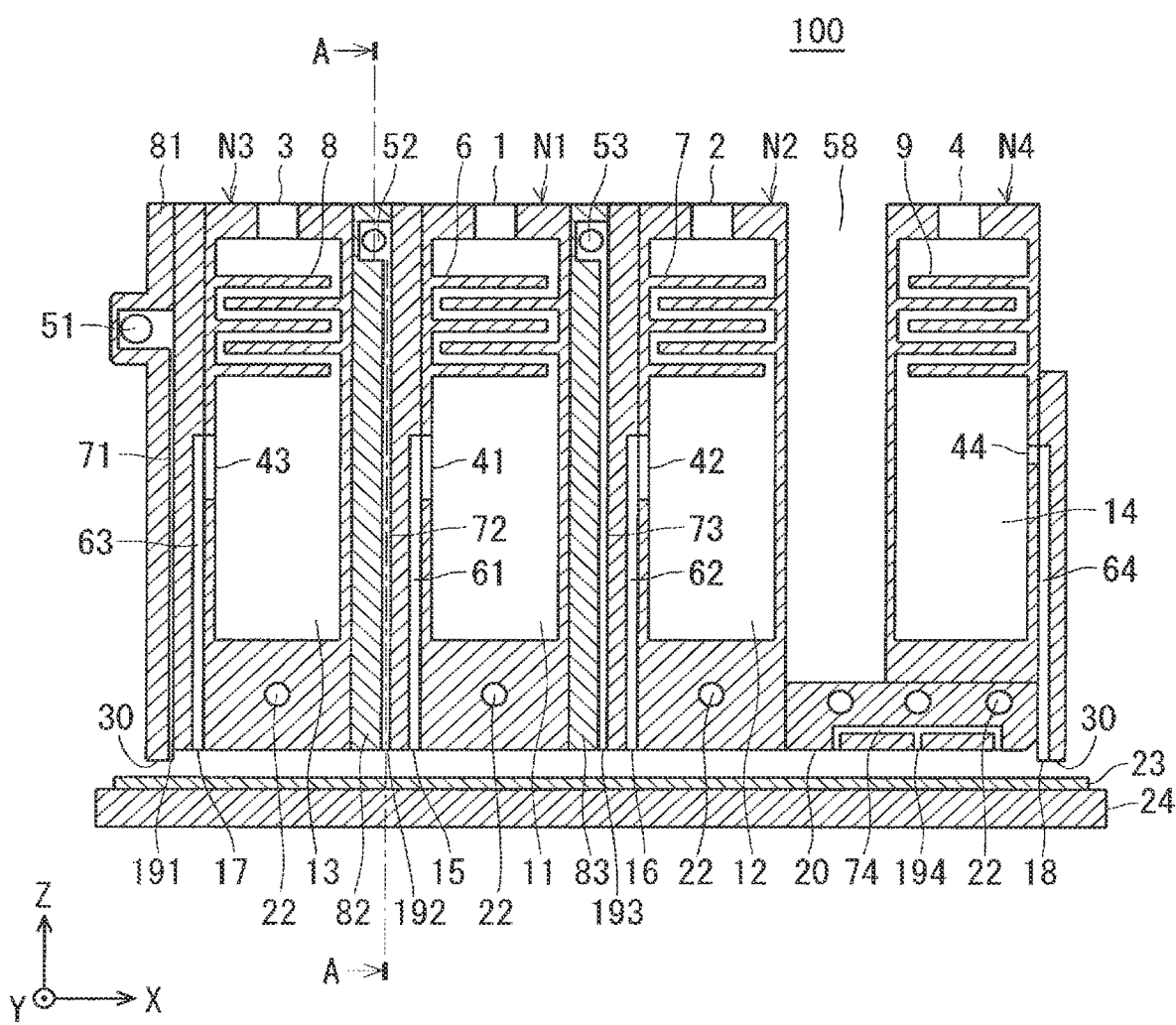

F I G . 2
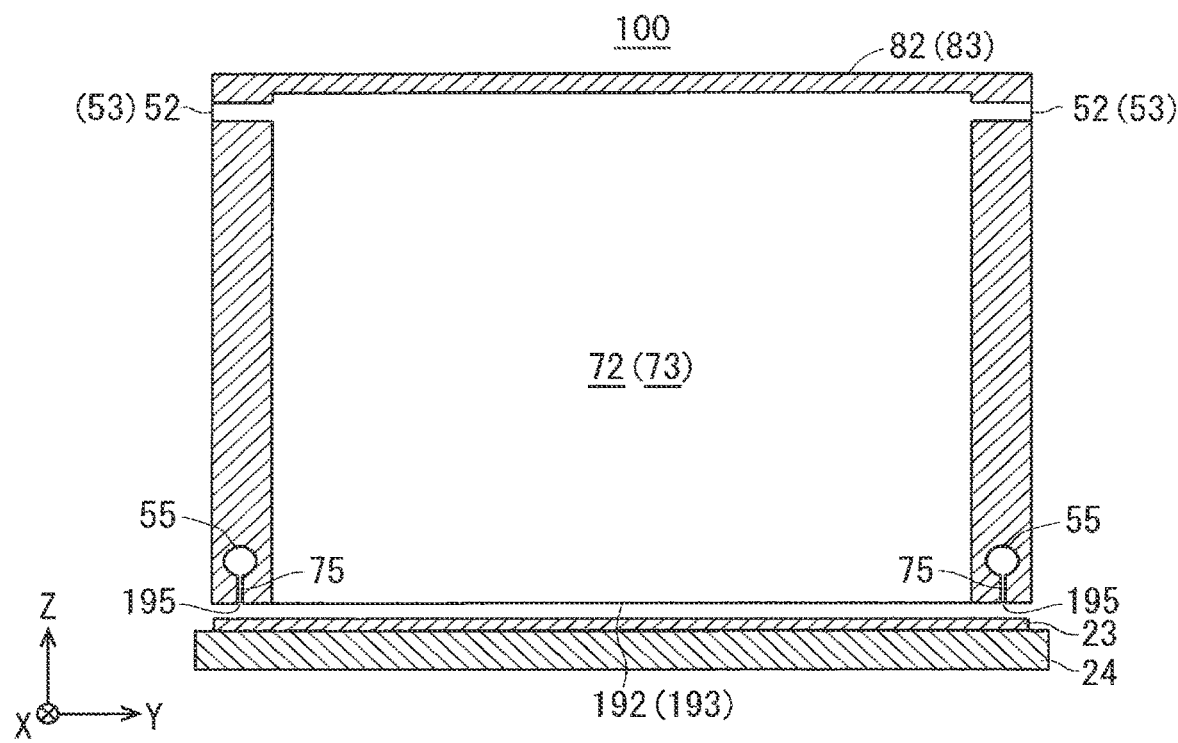
F I G . 3
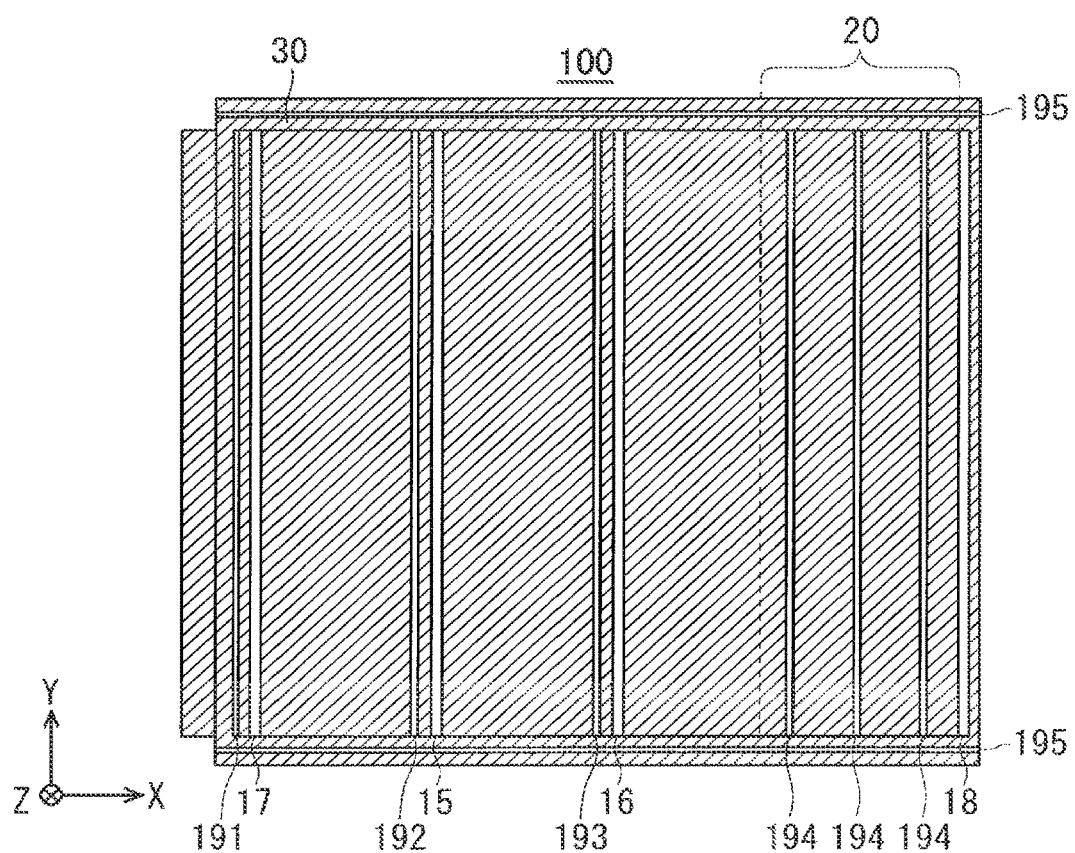

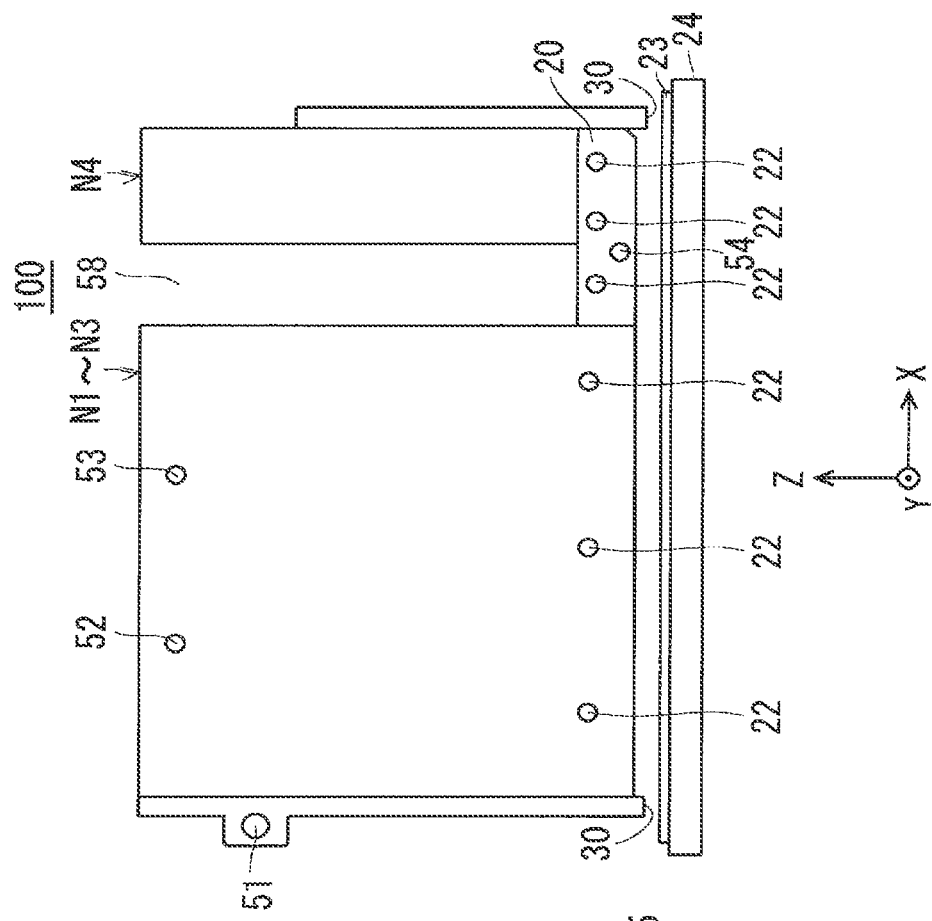
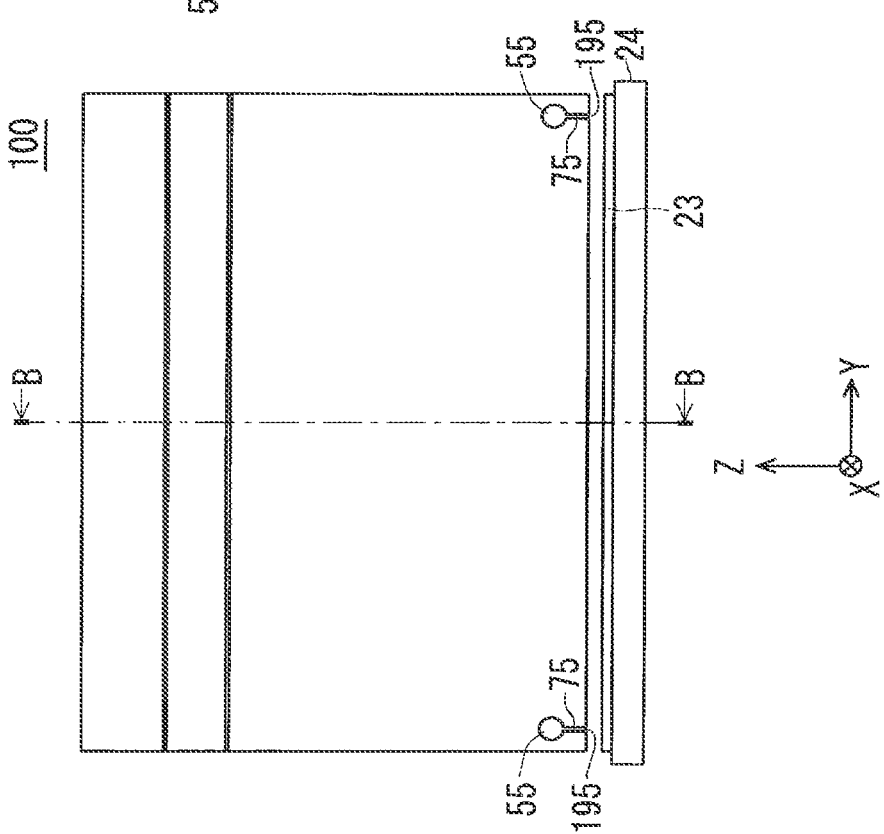

F I G . 7
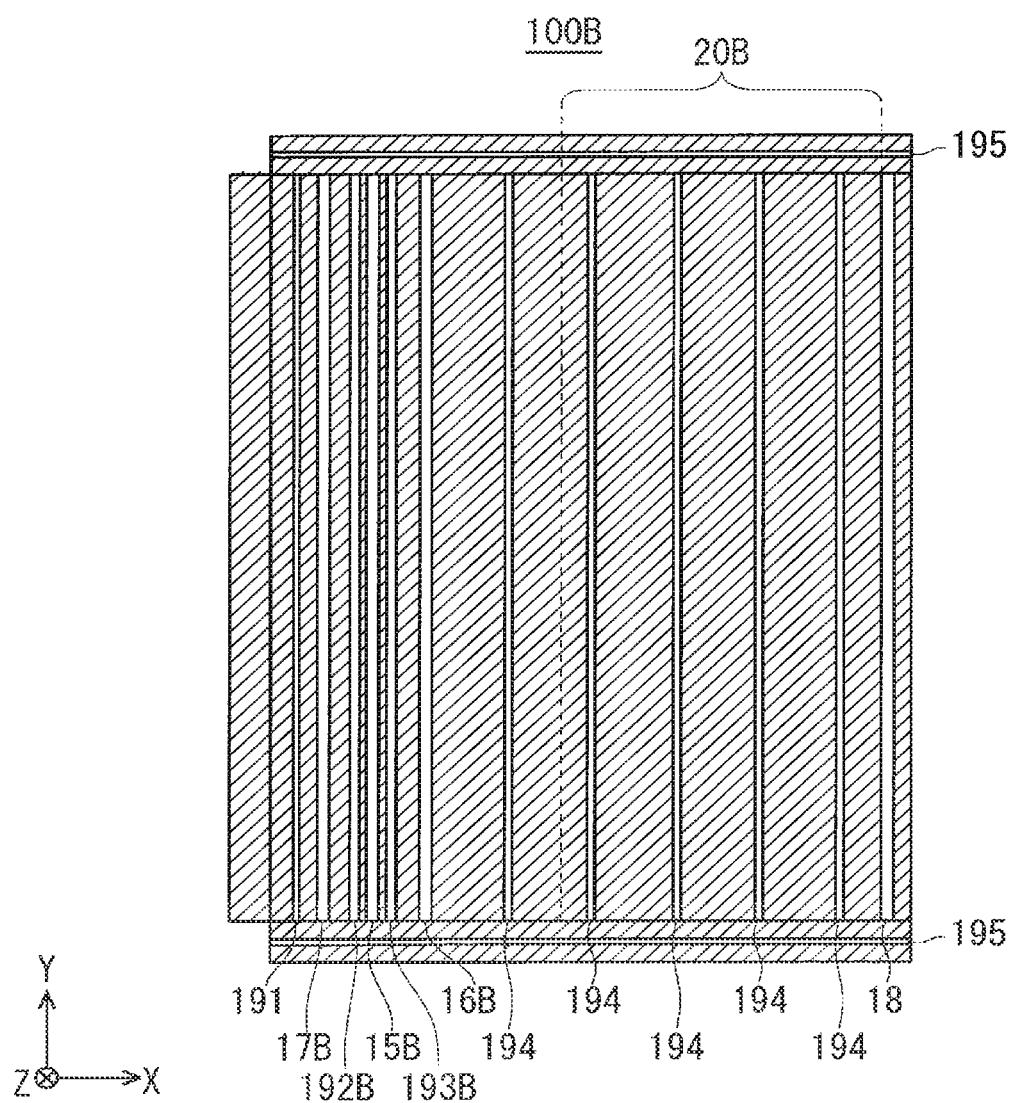

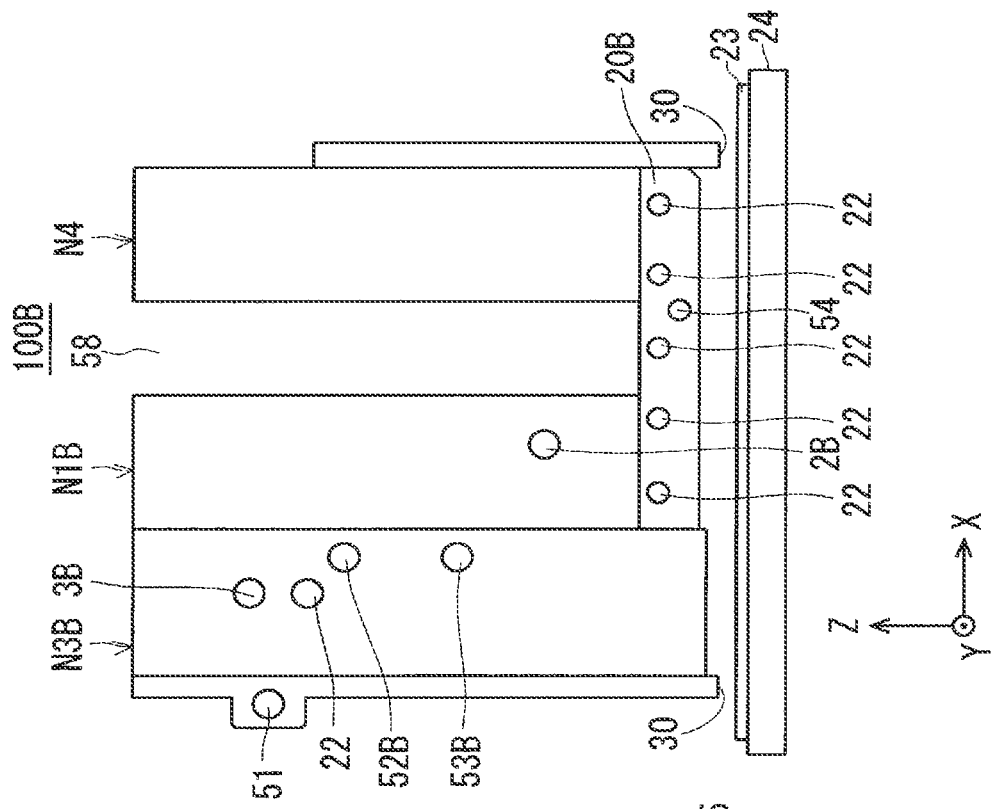
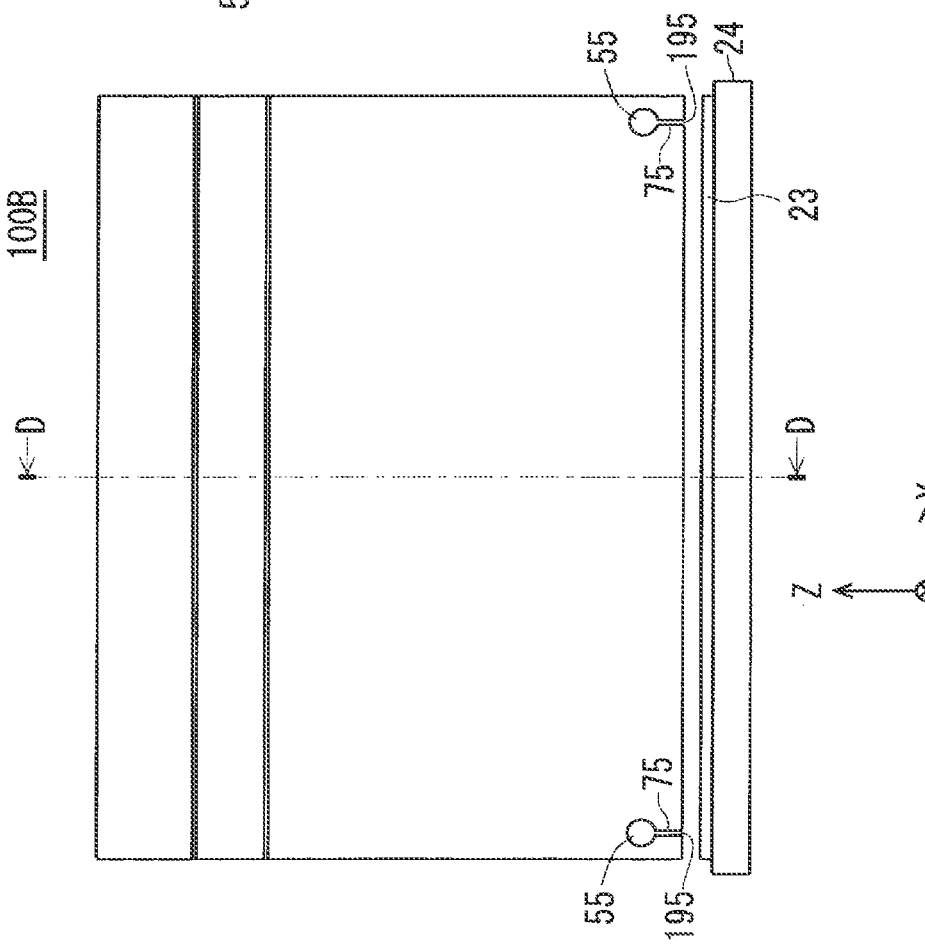

FILM FORMING DEVICE

TECHNICAL FIELD

The present invention relates to a film forming device for forming a film on a substrate.

BACKGROUND ART

As a method of forming a film on a substrate, there is a chemical vapor deposition (CVD) method. However, in the chemical vapor deposition method, it is often necessary to form a film under vacuum, and in addition to a vacuum pump or the like, there is a case where it is necessary to use a large vacuum container. Further, in the chemical vapor deposition method, there has been a problem that it is difficult to adopt a substrate having a large area as a substrate to be formed from the viewpoint of cost and the like. Therefore, a mist method capable of film forming processing under atmospheric pressure attracts attention.

As a conventional technique relating to a film forming device or the like utilizing a mist method, for example, there is a technique according to Patent Document 1.

In the technique according to the Patent Document 1, atomized raw material solution and reaction material are sprayed from a raw material solution ejection port and a reaction material ejection port provided in the bottom surface of the mist spray head including a mist spray nozzle or the like to a substrate disposed in the atmosphere. By this spraying, a predetermined film is formed on the substrate. The reaction material means a material which contributes to a reaction with the raw material solution.

PRIOR ART DOCUMENT

Patent Document

Patent Document 1: International Publication No. 2013/038484

SUMMARY

Problem to be Solved by the Invention

As described above, the film forming processing using the conventional film forming device is a process of forming a predetermined film on the substrate after obtaining a reaction product by reacting the atomized raw material solution and the reaction material. Therefore, in the conventional film forming device, there has been a problem that reaction products adhere to the vicinity of the raw material solution ejection port and the vicinity of the reaction material ejection port of the mist spray head during film formation, and clogging occurs in the ejection ports described above.

It is an object of the present invention to provide a film forming device having a structure of a mist spray head capable of solving the above problems and preventing occurrence of clogging.

Means to Solve the Problem

A film forming device according to the present invention is a film forming device which forms a film on a substrate by spraying an atomized raw material solution to an atmosphere, the film forming device including:

a mounting part on which the substrate is mounted; and a mist spray head which has a raw material solution ejection port, a reaction material ejection port and an inert gas ejection port at the bottom surface, and sprays, to the substrate mounted on the mounting part, the raw material solution from the raw material solution ejection port, a reaction material contributing to a reaction with the raw material solution from the reaction material ejection port, and an inert gas from the inert gas ejection port, wherein the inert gas ejection port is provided between the raw material solution ejection port and the reaction material ejection port.

Effects of the Invention

The objects, features, aspects, and advantages of the present invention will become more apparent from the following detailed description and the accompanying drawings.

BRIEF DESCRIPTION OF DRAWINGS

FIG. 1 is a cross sectional view showing a mist spray head of a film forming device according to Embodiment 1 of the present invention.

FIG. 2 is a cross sectional view showing a cross sectional structure taken along line A-A of FIG. 1.

FIG. 3 is a plan view of the mist spray head of Embodiment 1, as viewed from a bottom surface side.

FIGS. 4A and 4B are explanatory views showing an appearance structure and the like of a base plate of Embodiment 1.

FIG. 7 is a plan view of the mist spray head of Embodiment 2, as viewed from a bottom surface side.

FIGS. 8A and 8B are explanatory views showing an appearance structure and the like of a base plate of Embodiment 2.

DESCRIPTION OF EMBODIMENTS

Figure 5:
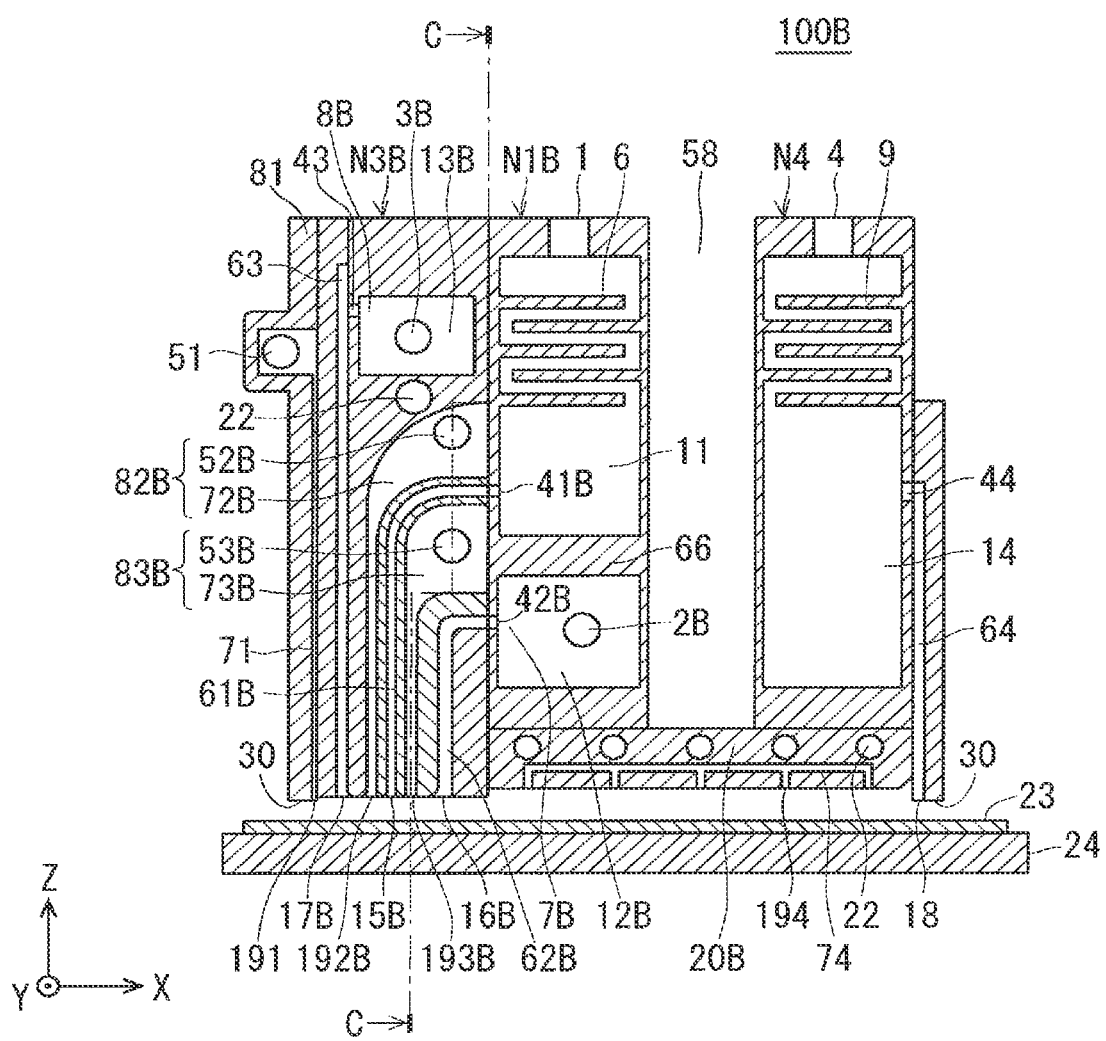
FIG. 5 is a cross sectional view showing a mist spray head of a film forming device according to Embodiment 2 of the present invention.

Hereinafter, the present invention will be described in detail with reference to the drawings illustrating its embodiments.

Embodiment 1

(Overall Structure)

FIG. 1 is a cross sectional view showing a mist spray head 100 and its periphery which are main components of a film forming device according to Embodiment 1 of the present invention. FIG. 2 is a cross sectional view showing a cross sectional structure taken along line A-A of FIG. 1. In FIGS. 1 and 2 and in FIGS. 3 to 8 shown later, XYZ orthogonal coordinate axes are also shown.

In the film forming device of Embodiment 1, a film is formed on a substrate 23 by spraying an atomized raw material solution to the atmosphere by the mist spray head 100. That is, the film forming device is a device for forming a desired film on the substrate 23 by the mist method, which is a film forming processing in the atmosphere.

Specifically, the raw material solution is contained in a container (not shown), and the raw material solution is atomized in the container by utilizing ultrasonic vibration.

Then, the atomized raw material solution is transported to the mist spray head 100 through a path not shown together with the carrier gas.

A substrate 23 is disposed on a mounting part 24 which is also a heater. That is, the mounting part 24 can heat the substrate 23. Then, the mist spray head 100 is disposed above the substrate 23.

That is, an upper surface of the substrate 23 and a bottom surface of the mist spray head 100 are arranged so as to be opposed to each other at a predetermined distance. Here, at the time of film forming processing, a distance between the bottom surface of the mist spray head 100 and the upper surface of the substrate 23 is set to about 0.1 mm to 50 mm. The mist spray head 100 and the substrate 23 are disposed at atmospheric pressure. Here, the space formed between the bottom surface of the mist spray head 100 and the upper surface of the substrate 23 is referred to as "reaction space".

The mist spray head 100 sprays the atomized raw material solution to the substrate 23 which is heated at a predetermined temperature by the mounting part 24. Thereby, a desired film is formed on the upper surface of the substrate 23. The mounting part 24 moves in a horizontal direction (predetermined direction defined in an X-Y plane) at the time of film forming processing. Alternatively, the mist spray head 100 moves in the above-mentioned horizontal direction.

Hereinafter, the configuration of the mist spray head 100 will be specifically described with reference to the drawings.

As shown in FIG. 1, the mist spray head 100 includes a raw material solution spray nozzle N1, two reaction material spray nozzles N2 and N3, an exhaust nozzle N4, and a base plate 20.

As shown in FIG. 1, the reaction material spray nozzle N3, the raw material solution spray nozzle N1, the reaction material spray nozzle N2, and the exhaust nozzle N4 are arranged side by side in this order along the X direction. Differing from the configuration shown in FIG. 1, it is also applicable to arrange the reaction material spray nozzle N2, the raw material solution spray nozzle N1, the reaction material spray nozzle N3, and the exhaust nozzle N4 side by side in this order along the X direction.

Although the raw material solution spray nozzle N1 and the reaction material spray nozzles N2 and N3 are provided with the inert gas spray parts 82 and 83 interposed therebetween, a side surface of the reaction material spray nozzle N2 and a side surface of the exhaust nozzle N4 are separated by a predetermined distance. That is, the raw material solution spray nozzle N1 and the reaction material spray nozzles N2 and N3 are disposed with no clearance along the X direction (horizontal direction) with the inert gas spray parts 82 and 83 interposed therebetween, and the exhaust nozzle N4 is disposed separately from (spaced apart from) other nozzles N1 to N3 in the X direction.

As described above, the raw material solution spray nozzle N1, the reaction material spray nozzles N2 and N3, and the exhaust nozzle N4 are arranged side by side in the horizontal direction (X direction). Here, at least the exhaust nozzle N4 is located at the outermost side (the right end (+X direction) in FIG. 1) of the mist spray head 100.

(Raw Material Solution Spray Nozzle N1)

First, the configuration of the raw material solution spray nozzle N1 will be described.

The raw material solution spray nozzle N1 is a nozzle for spraying the atomized raw material solution from the raw material solution ejection port 15 formed in the bottom surface. In the raw material solution spray nozzle N1, a cavity 11 (first cavity) is formed. Further, on the upper surface of the raw material solution spray nozzle N1, a raw material solution supply part 1 is disposed. As described above, the raw material solution is atomized outside the mist spray head 100. The atomized raw material solution is transported to the raw material solution supply part 1 through a path not shown together with the carrier gas. The atomized raw material obtained from the raw material solution supply part 1 fills (is supplied to) the cavity 11 in the raw material solution spray nozzle N1.

In addition, a plurality of flow-regulating parts 6 (first flow-regulating part) are provided on both side surface portions in the cavity 11 of the raw material solution spray nozzle N1. The flow-regulating part 6 is a flow-regulating plate, and can regulate the flow in the cavity 11 of the atomized raw material solution supplied from the raw material solution supply part 1. Specifically, a plurality of flow-regulating parts 6 having a rectangular shape in plan view are arranged from the opposite side surfaces along the X-Y plane while alternately changing the formation heights in the cavity 11. Each of the plurality of flow-regulating parts 6 is configured so as to form a clearances with an opposite side surface without reaching the opposite side surface.

A main part of the cavity 11 is provided below the plurality of flow-regulating parts 6. A small space (of the cavity 11) above the plurality of flow-regulating parts 6 is connected to (the main part of) the cavity 11 through a clearance formed by the plurality of the flow-regulating parts 6, and the cavity 11 is connected to the raw material solution discharge part 41 described later.

The raw material solution discharge part 41 is provided in one side surface portion (side surface on the left (−X direction) side in FIG. 1) in the cavity 11. Further, the raw material solution discharge part 41 is disposed at a position away from a bottom surface of the raw material solution spray nozzle N1 (cavity 11).

On the other hand, as described above, the raw material solution ejection port 15 is provided in the bottom surface of the mist spray head 100, that is, the surface of the mist spray head 100 which corresponds to the upper surface of the substrate 23. Here, the atomized raw material solution is ejected from the raw material solution ejection port 15 to the upper surface of the substrate 23.

A passage 61 extending in the Z direction is disposed in the mist spray head 100. Then, the raw material solution discharge part 41 is connected to the raw material solution ejection port 15 via the passage 61.

FIG. 3 is a plan view of the mist spray head 100 as viewed from a side where the substrate 23 is disposed (−Z direction side). That is, FIG. 3 is a plan view showing a bottom surface structure of the mist spray head 100. As shown in the drawing, the bottom surface of the mist spray head 100 assumes a rectangular shape defined by an X direction (second direction) and a Y direction (first direction).

As shown in FIG. 3, the raw material solution ejection port 15 assumes a slit shape which is an elongated opening whose longitudinal direction is a Y direction (first direction) in plan view. A width of the opening of the raw material solution ejection port 15 (dimension in the X direction in FIG. 3) is about 0.1 mm to 10 mm.

In the raw material solution spray nozzle N1, the atomized raw material solution is supplied into the cavity 11 from the raw material solution supply part 1. Then, the raw material solution is regulated by the plurality of flow-regulating parts 6, fills the small space above the plurality of flow-regulating parts 6, then is guided to the cavity 11, and fills the cavity 11. Thereafter, the atomized raw material solution is guided from the raw material solution discharge part 41 to the raw material solution ejection port 15 via the passage 61. Then, the atomized raw material solution is ejected from the raw material solution ejection port 15 toward the upper surface of the substrate 23.

(Reaction Material Spray Nozzles N2 and N3)

Next, the configuration of the reaction material spray nozzles N2 and N3 (first and second reaction material spray nozzles) will be described. Since the first and second reaction materials to be sprayed are independent of each other and the constitutions of the reaction material spray nozzles N2 and N3 are the same except forming positions, in the following description, the explanation will be made around the reaction material spray nozzle N2 with reference to the explanation of the reaction material spray nozzle N3 as appropriate.

Between the reaction material spray nozzles N2 and N3, a plurality of flow-regulating parts 7 and 8, reaction material supply parts 2 and 3, cavities 12 and 13, reaction material discharge parts 42 and 43, passages 62 and 63, and the reaction material ejection ports 16 and 17 (first and second reaction material ejection ports) each have a relation of corresponding to each other. In addition, the first and second reaction materials used in the reaction material spray nozzles N2 and N3, respectively, may be the same or different.

The reaction material spray nozzle N2 is a nozzle which ejects a reaction material (e.g., oxidizing agent) contributing to the reaction with the raw material solution to the substrate 23. A cavity 12 (a second cavity) is formed in the reaction material spray nozzle N2. Further, a reaction material supply part 2 is provided in the upper surface of the reaction material spray nozzle N2. The reaction material (first reaction material) is supplied from the outside of the reaction material spray nozzle N2 to the inside of the cavity 12 via the reaction material supply part 2. On the other hand, in the reaction material spray nozzle N3, the reaction material (second reaction material) is supplied from the outside of the reaction material spray nozzle N3 to the inside of the cavity 13 via the reaction material supply part 3 provided in the upper surface.

Here, the first and second reaction materials may be gas or liquid. In the case of a liquid, the liquid (reaction material) atomized by using ultrasonic vibration or the like is transported into the reaction material spray nozzle N2 (N3) through a path not shown together with the carrier gas. The first reaction material (second reaction material) obtained from the reaction material supply part 2 (3) fills (is supplied to) the cavity 12 (13) in the reaction material spray nozzle N2 (N3).

In addition, a plurality of flow-regulating parts 7 (second flow-regulating part) are provided in the cavity 12 of the reaction material spray nozzle N2. The flow-regulating part 7 is a flow-regulating plate, and can mainly regulate the flow in the cavity 12 of the reaction material supplied from the reaction material supply part 2. Specifically, a plurality of flow-regulating parts 7 having a rectangular shape in plan view are arranged from the opposite side surfaces along the X-Y plane while alternately changing the formation heights in the cavity 12. Each of the plurality of flow-regulating parts 7 is configured so as to form a clearances with an opposite side surface without reaching the opposite side surface.

In the reaction material spray nozzle N2 (N3), the small space (in the cavity 12) above the plurality of flow-regulating parts 7 (8) and the main part of the cavity 12 (13) are connected to each other via a clearance formed by the plurality of flow-regulating parts 7 (8). Further, the small space is connected to the reaction material supply part 2 (3), and the cavity 12 (13) is connected to a reaction material discharge part 42 (43) described later.

The reaction material discharge part 42 is provided in one side surface portion (side surface on the left (−X direction) side in FIG. 1) in the cavity 12. Further, the reaction material discharge part 42 is disposed at a position away from a bottom surface of the reaction material spray nozzle N2 (cavity 12).

On the other hand, in the mist spray head 100, a reaction material ejection port 16 is provided in the bottom surface of the mist spray head 100, that is, in the side of the mist spray head 100 which faces the substrate 23. Here, the reactive material is ejected from the reaction material ejection port 16 to the upper surface of the substrate 23.

A passage 62 (63) is provided along the Z direction in the mist spray head 100. The reaction material discharge part 42 (43) is connected to the reaction material ejection port 16 (17) via the passage 62 (63). As shown in FIG. 3, each of the reaction material ejection ports 16 and 17 assumes a slit shape which is an elongated opening whose longitudinal direction is a Y direction (first direction) in plan view. The width of the opening of each of the reaction material ejection ports 16 and 17 (dimension in the X direction in FIG. 3) is about 0.1 mm to 10 mm.

In the reaction material spray nozzle N2 (N3), the reaction material is supplied from the reaction material supply part 2 (3) to the inside of the cavity 12 (13). Then, the reaction material is regulated by the plurality of flow-regulating parts 7 (8), fills the small space above the plurality of flow-regulating parts 7 (8), then is guided to the main part of the cavity 12 (13), and fills the cavity 12 (13). Thereafter, the reaction material is guided from the reaction material discharge part 42 (43) to the reaction material ejection port 16 (17) via the passage 62 (63). Then, the reaction material is ejected from the reaction material ejection port 16 toward the upper surface of the substrate 23.

(Exhaust Nozzle N4)

Next, the configuration of the exhaust nozzle N4 will be described.

The exhaust nozzle N4 is a nozzle for performing exhaust processing. The exhaust nozzle N4 performs exhaust processing at a flow rate (Q4) equal to or larger than a sum of a flow rate (Q1) at which the raw material solution spray nozzle N1 ejects the raw material solution and a flow rate (Q2 and Q3) at which the reaction material spray nozzle N2 (N3) eject the reaction materials. That is, {exhaust flow rate Q4≥raw material solution ejection flow rate Q1+reaction material ejection flow rate Q2+Q3}.

A cavity 15 (third cavity) is formed inside the exhaust nozzle N4. Further, an exhaust material outlet 4 is provided in an upper surface of the exhaust nozzle N4. The exhaust material outlet 4 is provided in the upper surface of the exhaust nozzle N4, and specifically, the exhaust material outlet 4 is provided above an exhaust material introduction part 44 described later to discharge an exhaust material outside the exhaust nozzle N4 from the cavity 14.

Here, the exhaust material is a reaction residue and the like from the reaction space. The exhaust material outlet 4 is connected to an exhaust pump (not shown) via a path (not shown). That is, the exhaust is sucked from the exhaust nozzle N4 to the exhaust pump through the exhaust material outlet 4 and the above-mentioned path.

In addition, a plurality of flow-regulating parts 9 (third flow-regulating parts) are provided in the cavity 14 of the exhaust nozzle N4. The flow-regulating part 9 is a flow-regulating plate, and can mainly regulate the flow in the cavity 14 of the exhaust material to be discharged from the exhaust material outlet 4. Specifically, a plurality of flow-regulating parts 9 having a rectangular shape in plan view are arranged from the opposite side surfaces along the X-Y plane while alternately changing the formation heights in the cavity 14. Each of the plurality of flow-regulating parts 9 is configured so as to form a clearances with an opposite side surface without reaching the opposite side surface.

The plurality of flow-regulating parts 9 separate the cavity 14 of the exhaust nozzle N4 into a plurality of small spaces. Here, the small spaces which are adjacent to each other are connected via small clearances formed by the flow-regulating parts 9. The plurality of small spaces include a small space (of the cavity 14) located at an uppermost portion of the exhaust nozzle N4, and a lower portion of the plurality of flow-regulating parts 9 is a main part of the cavity 14. Here, the small space above the plurality of flow-regulating parts 9 is connected to the exhaust material outlet 4, and (the main part of) the cavity 14 is connected to the exhaust material introduction part 44 described later.

The exhaust material introduction part 44 is provided in the other side surface portion in the cavity 14. Further, the exhaust material introduction part 44 is disposed at a position away from a bottom surface of the cavity 14 of the exhaust nozzle N4.

On the other hand, in the mist spray head 100, an exhaust port 18 is provided in the bottom surface of the mist spray head 100, that is, in the bottom surface of the reaction material spray nozzle N2. Here, the exhaust port 18 performs an exhaust process on the reaction space.

In the mist spray head 100, a passage 64 is arranged along the Z direction. The exhaust material introduction part 44 is connected to the exhaust port 18 via a passage 64. As shown in FIG. 3, the exhaust port 18 assumes a slit shape which is an elongated opening hole whose longitudinal direction is a Y direction (first direction) in plan view. The width of the opening of the exhaust port 18 (dimension in the X direction in FIG. 3) is about 0.1 mm to 10 mm.

(Inert Gas Spray Part)

The inert gas spray part 81 is provided in a frame 30 or in a region adjacent to the frame 30 at the end of the mist spray head 100 of Embodiment 1 (end on the left (−X direction) side in FIG. 1).

Further, the mist spray head 100 is characterized in that in addition to the inert gas spray part 81, the inert gas spray part 82 and the inert gas spray part 83 are provided between the raw material solution spray nozzle N1 and the reaction material spray nozzle N3 and between the raw material solution spray nozzle N1 and the reaction material spray nozzle N2, respectively.

The inert gas spray part 81 is mainly composed of an inert gas supply part 51, a passage 71, and an inert gas ejection port 191, the inert gas spray part 82 is mainly composed of an inert gas supply part 52, a passage 72, and an inert gas ejection port 192 (second inert gas ejection port), and the inert gas spray part 83 is mainly composed of an inert gas supply part 53, a passage 73, and an inert gas ejection port 193 (first inert gas ejection port).

As shown in FIG. 2, in the inert gas spray part 82, the inert gas introduced from the outside into the inert gas supply part 52 is guided to the inert gas ejection port 192 formed in the bottom surface of the mist spray head 100 (inert gas spray part 82) via the passage 72, and is ejected from the inert gas ejection port 192. As with the inert gas supply part 52, the inert gas supply parts 51 and 53 also eject the inert gas from the inert gas ejection ports 191 and 193 formed in the bottom surface of the mist spray head 100 (inert gas spray parts 81 and 83) via the passages 71 and 73. As the inert gas, nitrogen, argon, or the like can be considered.

The inert gas supply parts 51 to 53 communicate with the inert gas ejection ports 191 to 193, respectively, but the opening area of each of the inert gas supply parts 51 to 53 is desirably set to an area equal to or greater than the opening area of each of the inert gas ejection ports 191 to 193.

Furthermore, it is desired that the flow rate at which each of the inert gas ejection ports 191 to 193 ejects the inert gas is set to each of a flow rate at which the raw material solution ejection port 15 ejects the raw material solution and flow rates at which the reaction material ejection ports 16 and 17 eject the reaction material or less.

The inert gas spray parts 82 and 83 have the same overall configuration except for the forming position and the insert gas to be used.

Further, as shown in FIG. 2, inert gas introduced into the two inert gas supply parts 55 provided at both ends in the Y direction is ejected from two inert gas ejection ports 195 formed in the bottom surface of the mist spray head 100 via the passages 75 respectively.

As described above, the inert gas ejection port 195 is provided in the frame 30 or in the region adjacent to the frame 30 described above.

With the above-described configuration, the inert gas sent from the outside of the mist spray head 100 through the inert gas supply parts 51 to 53 of the inert gas spray parts 81 to 83 and the inert gas supply part 55 is supplied into the mist spray head 100. The passages 71 to 73 and the passage 75 are provided in the mist spray head 100, and the supplied inert gas propagates through the passages 71 to 73 and the passage 75. The inert gas ejection ports 191 to 193 and the inert gas ejection port 195 are provided in the bottom surface (side facing the substrate 23) of the mist spray head 100, and the inert gas is sprayed from the inert gas ejection ports 191 to 193 and the inert gas ejection port 195 toward the upper surface of the substrate 23.

FIGS. 4A and 4B are explanatory views showing the appearance structure and the like of the base plate 20 as viewed from the Y direction. FIG. 4A is a side view of the mist spray head 100 as viewed from the left side surface (−X direction), and FIG. 4B is a front view as viewed from the front (+Y direction). The cross sectional structure taken along line B-B of FIG. 4A is a sectional view shown in FIG. 1.

As described above, the exhaust nozzle N4 is disposed separately from the other nozzles N1 to N3 in the X direction. Accordingly, an open ceiling part 58 is generated between the exhaust nozzle N4 and the other nozzles N1 to N3. Thus, the mist spray head 100 includes the base plate 20. The base plate 20 covers the open ceiling part 58 from a side where the substrate 23 is disposed (refer to FIG. 1, FIG. 3, and FIG. 4B). The exhaust nozzle N4 is provided on the upper surface of the base plate 20.

As shown in FIG. 1, FIG. 3, and FIG. 4B, an inert gas supply part 54 (refer to FIG. 4B), a passage 74 (refer to FIG. 1 and FIG. 3), and a plurality of inert gas ejection ports 194 (third inert gas ejection ports) are provided in the base plate 20 of the mist spray head 100 of Embodiment 1.

In the base plate 20, the inert gas sent from the outside of the mist spray head 100 via the inert gas supply part 54 is supplied to the base plate 20. The passage 74 is provided in the base plate 20, and the supplied inert gas propagates in the passage 74. The plurality of inert gas ejection ports 194 are provided in the bottom surface (side facing the substrate 23)

of the base plate 20, and the inert gas is sprayed from the plurality of inert gas ejection ports 194 toward the upper surface of the substrate 23.

As shown in FIG. 3, each of the inert gas ejection ports 191 to 194 has a slit shape which is an elongated opening hole whose longitudinal direction is a Y direction (first direction) in plan view. On the other hand, the inert gas ejection port 195 has a slit shape which is an elongated opening hole whose longitudinal direction is the X direction (second direction) in plan view. The widths of the openings of the inert gas ejection ports 191 to 195 (the dimension in the X direction in FIG. 3 with the inert gas ejection ports 191 to 194, and the dimension in the Y direction in FIG. 3 with the inert gas ejection port 195) is about 0.1 mm to 10 mm.

Therefore, the inert gas ejection port 192 (second inert gas ejection port) is provided between the raw material solution ejection port 15 and the reaction material ejection port 17 (second reaction material ejection port), and an inert gas ejection port 193 (first inert gas ejection port) is provided between the raw material solution ejection port 15 and the reaction material ejection port 16 (first reaction material ejection port). That is, in the mist spray head 100 of Embodiment 1, it is characterized that the inert gas ejection ports 193 and 192 are provided between the raw material solution ejection port 15 and the reaction material ejection ports 16 and 17, respectively.

Further, in the base plate 20 of Embodiment 1 shown in FIG. 1 and FIG. 4B, a temperature adjustment mechanism 22 is disposed. The temperature adjustment mechanism 22 can adjust the temperature in the base plate 20. Specifically, this is realized by providing a coolant and a heater in a hole portion constituting the temperature adjustment mechanism 22.

As shown in FIG. 1 and FIG. 3, the reaction material ejection port 17, the raw material solution ejection port 15, the reaction material ejection port 16, and the exhaust port 18 are arranged in this order in the X direction. Although different from the drawing, the reaction material ejection port 16, the raw material solution ejection port 15, the reaction material ejection port 17, and the exhaust port 18 may be arranged in this order in the X direction.

As described above, in the mist spray head 100 of Embodiment 1, the bottom surface of the raw material solution spray nozzle N1, the bottom surfaces of the reaction material spray nozzles N2 and N3, and the bottom surface of the base plate 20 are configured so as to be flush. Accordingly, the raw material solution ejection port 15, the reaction material ejection ports 16 and 17, and the inert gas ejection ports 192 to 194 are provided in a flush bottom surface of the mist spray head 100.

Referring to FIG. 3, the mist spray head 100 has a frame 30 of the mist spray head 100 on a side (bottom surface) facing substrate 23. The frame 30 is a portion close to the edge of the bottom surface of the mist spray head 100 and is a portion which is bordered so as to surround the bottom inside surface of the mist spray head 100 from the surroundings. As is apparent from FIG. 1, the frame 30 protrudes toward the substrate 23 side. The protrusion length is set to, for example, the range from 0.1 to 10 mm.

That is, the reaction space is surrounded by the frame 30. However, the end of the frame 30 and the upper surface of the substrate 23 are not in contact with each other.

When the atomized raw material solution and two reaction materials are sprayed into the reaction space from the raw material solution ejection port 15 and the reaction material ejection ports 16 and 17 of the mist spray head 100, the raw material solution and the two reaction materials react on the heated substrate 23, and a desired film is formed on the upper surface of the substrate 23. The reaction residues and the like in the reaction space are excluded from the reaction space by the exhaust nozzle N4.

In addition, in the mist spray head 100 of Embodiment 1, as with the base plate 20, the temperature adjustment mechanism 22 is disposed in each of the raw material solution spray nozzle N1 and the reaction material spray nozzles N2, N3.

(Effect Etc.)

In the mist spray head 100 of Embodiment 1, the inert gas spray part 83 (first inert gas spray part) is provided between the raw material solution spray nozzle N1 and the reaction material spray nozzle N2, and the inert gas spray part 82 (second inert gas spray part) is provided between the raw material solution ejection port 15 and the reaction material spray nozzle N3.

The mist spray head 100 of Embodiment 1 having the above configuration is characterized in that by combining the raw material solution spray nozzle N1, the reaction material spray nozzles N2 and N3, and the inert gas spray parts 82 and 83, the inert gas ejection ports 193 and 192 are provided between the raw material solution ejection port 15 and the reaction material ejection ports 16 and 17, respectively.

Therefore, in the film forming device of Embodiment 1, by ejecting the inert gas from the inert gas ejection ports 192 and 193, it is possible to reduce the adhesion of reaction products to each of the vicinity of the raw material solution ejection port 15 and vicinities of the reaction material ejection ports 16 and 17. As a result, the mist spray head 100 of Embodiment 1 achieves the effect that clogging of the raw material solution ejection port 15 and the reaction material ejection ports 16 and 17, respectively, can be reliably avoided Further, the ejection ports 15 to 17, and the inert gas ejection ports 191 to 194 respectively formed in the bottom surface of the mist spray head 100 of Embodiment 1 are formed in a slit shape in which a first direction (Y direction) is a longitudinal direction. Therefore, it is possible to evenly spray the atomized raw material solution to the large-area substrate 23.

Further, the mounting part 24 or the mist spray head 100 is movable in the horizontal direction. Therefore, the film forming processing using the film forming device (mist spray head 100) according to the present embodiment can be performed on an entire surface of the substrate 23 having the large surface area.

A uniformly atomized raw material solution or the like can be sprayed to the upper surface of the substrate 23, for example, by performing the film forming processing by the film forming device while moving the mist spray head 100 in the X direction.

Further, by forming the reaction material ejection port 16 (17) in a slit shape, the reaction material can be sprayed evenly to the upper surface of the large-area substrate 23.

In addition, by forming the exhaust port 18 in a slit shape, the exhaust processing can be performed over a wider range. Further, it is possible to equalize the flow in the X direction in which the raw material solution or the like flows toward the exhaust port 18.

Further, in the film forming device of Embodiment 1, by setting the opening area of each of the inert gas supply parts 51 to 53 to an area equal to or greater than the opening area of each of the inert gas ejection ports 191 to 193, that is, by setting the opening area of each of the inert gas ejection ports 191 to 193 to an area equal to or less than the opening area of each of the inert gas supply parts 51 to 53, the effect that a pressure difference can be set between the inert gas ejection port 191 or the like and the inert gas supply part 51 and the inert gas can be uniformly spread over the upper surface of the substrate 23 at the time of film formation, is achieved.

In addition, in the film forming device of Embodiment 1, the flow rate at which each of the inert gas ejection ports 192 and 193 ejects the inert gas is set to a flow rate equal to or less than each of a flow rate at which the raw material solution ejection port 15 ejects the raw material solution and flow rates at which the reaction material ejection ports 16 and 17 eject the reaction material.

Therefore, the film forming device of Embodiment 1 can suppress the phenomenon of impairing the reaction between the raw material solution and the reaction material by ejecting the inert gas.

Further, the mist spray head 100 of the film forming device according to Embodiment 1 has the raw material solution spray nozzle N1. The raw material solution spray nozzle N1 is provided with, in the cavity 11, the raw material solution discharge part 41 provided in the one side surface side at a position away from the bottom surface of the cavity 11.

Accordingly, even if the raw material solution reacts with the residual moisture in the cavity 11 in the raw material solution spray nozzle N1 to produce particles, the particles are trapped in the region from the bottom surface to the raw material solution discharge part 41 in the cavity 11. That is, the region in the cavity 11 functions as a particle trap, and particles are captured in the region and can be prevented from being transported to the raw material solution discharge part 41, the passage 61, and the raw material solution ejection port 15. Therefore, it is also possible to prevent particles from adhering and causing clogging in the parts 41, 61, 15.

Although, differing from the above configuration, the installation of the plurality of flow-regulating parts 6 may be omitted, a plurality of flow-regulating parts 6 are disposed in the cavity 11 in the raw material solution spray nozzle N1.

Therefore, the flow of the atomized raw material solution in the cavity 11 can be regulated, which makes it more reliable to capture the particles in the region functioning as a particle trap.

In addition, the side surface portion to which the lowermost flow-regulating part 6 among the plurality of flow-regulating parts 6 is attached and the side surface in which the raw material solution discharge part 41 is provided are the same (both of the side surface portions are provided on the one side surface portion (left side)). Thus, droplets or the like can also be prevented from running down the one side surface portion and flowing into the raw material solution discharge part 41.

Although, differing from the above configuration, the installation of the reaction material spray nozzles N2 and N3 may be omitted, the mist spray head 100 has the reaction material spray nozzles N2 and N3. Accordingly, the reaction can be promoted in the film forming processing in the atmosphere. Also, a wide variety of films can be formed.

Furthermore, the mist spray head 100 of Embodiment 1 has two reaction material spray nozzles N2, N3. Herein, the raw material solution spray nozzle N1 is laterally sandwiched between the reaction material spray nozzle N2 (first reaction material spray nozzle) and the reaction material spray nozzle N3 (second reaction material spray nozzle).

Accordingly, different reaction materials can be ejected to the reaction space. Therefore, various types of films can be formed on the substrate 23. In addition, when the same reaction material is ejected from the reaction material spray nozzles N2, N3, a speed of forming the desired film on the substrate 23 can be enhanced.

Further, each of the reaction material spray nozzles N2, N3 has a temperature adjustment mechanism 22. Accordingly, for example, a liquid drop accumulating in the reaction material spray nozzles N2, N3 can be evaporated. Therefore, the evaporated reaction material can be used as a reaction material to be sprayed from the reaction material spray nozzles N2, N3.

In addition, the temperature adjustment mechanism 22 is also disposed in the raw material solution spray nozzle N1. Therefore, the raw material solution, for example, can be kept in a mist state. That is, it can be prevented that the droplet of the raw material solution sprayed from the raw material solution spray nozzle N1 becomes large and then the raw material solution which becomes a large liquid drop drops on the upper surface of the substrate 23.

Further, a plurality of inert gas ejection ports 194 (third inert gas ejection ports) which spray the inert gas to the substrate 23 are provided in the bottom surface of the base plate 20. Accordingly, the raw material solution or the like existing under the base plate 20 can be pressed against the upper surface of the substrate 23. Therefore, the utilization efficiency of the raw material solution and the like can be enhanced.

Further, the base plate 20 has the temperature adjustment mechanism 22. Therefore, the raw material solution and the like can be kept in a mist state in the reaction space. In addition, adhesion of liquid droplets to the base plate 20 can be prevented. Furthermore, a film forming reaction on the substrate 23 can be promoted.

The inert gas ejection ports 191, 195 which spray the inactive gas to the substrate 23 are provided in the frame 30 of the mist spray head 100 or in the vicinity of the frame 30. Therefore, the reaction space can be surrounded with the inert gas, so that the diffusion of the raw material solution or the like from the reaction space can be suppressed.

Further, the reaction material spray nozzle N2 (N3) is provided with, in the cavity 12 (13), the reaction material discharge part 42 (43) provided on the one side surface side at a position away from the bottom surface of the cavity 12.

Therefore, even if the reaction material reacts with the atmosphere in the cavity 12 (13) in the reaction material spray nozzle N2 (N3) to produce particles, the particles are trapped in the region from the bottom surface to the reaction material discharge part 42 (43) in the cavity 12. That is, the region in the cavity 12 (13) functions as a particle trap, and particles are captured in the region and can be prevented from being transported to the reaction material discharge part 42 (43), the passage 62 (63), and the reaction material ejection port 16 (17). Therefore, it is also possible to prevent particles from adhering and clogging in the parts 42, 62, 16 (43, 63, 17).

Although, differing from the above configuration, the installation of the plurality of flow-regulating parts 7 may be omitted, a plurality of flow-regulating parts 7 (8) are disposed in the cavity 12 (13) in the reaction material spray nozzle section N2 (N3).

Therefore, the flow of the reaction material in the cavity 12 (13) can be regulated, which makes it more reliable to capture the particles in the region functioning as a particle trap. In addition, in the cavity 12, the side surface portion to which the lowermost flow-regulating part 7 (8) among the plurality of flow-regulating parts 7 (8) is attached and the side surface in which the reaction material discharge part 42

(43) is provided are the same (both of the side surface portions are provided on the one side surface portion (side surface on a left side)). Thus, droplets or the like can also be prevented from running down the one side surface portion and flowing into the reaction material discharge part 42 (43).

Although, differing from the above configuration, the installation of the exhaust nozzle N4 may be omitted, the mist spray head 100 has the exhaust nozzle N4. Therefore, the flow of the raw material solution and the reaction material moving to the exhaust nozzle N4 can be generated. Thus, a turbulence in the flow of the raw material solution or the like in the reaction space can be prevented, so that a film quality of the film to be formed can be improved. In addition, the diffusion of the raw material solution or the like outside the reaction space can be suppressed.

Further, in the exhaust processing, the flow rate is controlled so as to satisfy (exhaust flow rate Q4≥raw material solution ejection flow rate Q1+reaction material ejection flow rate Q2+Q3). Therefore, the raw material solution and the two reaction materials sprayed to the inside of the reaction space can make the flow in the reaction space more reliable. In addition, the raw material solution and the two reaction materials can be prevented reliably from diffusing outward from the reaction space.

In addition, the reaction material spray nozzle N3, the raw material solution spray nozzle N1, the reaction material spray nozzle N2, and the exhaust nozzle N4 are arranged side by side in the X direction (horizontal direction), and at least the exhaust nozzle N4 is located on an outermost side of the mist spray head 100.

Accordingly, the raw material solution and the two reaction material moves to the outermost side of the mist spray head 100 in the reaction space. Therefore, a region where the raw material solution and the reaction material contact the substrate 23 is maximized, so that a generation of an unreacted raw material solution in the reaction space can be minimized.

The exhaust nozzle N4 is provided with, in the cavity 14, the exhaust material introduction part 44 provided on the other side surface side at a position away from the bottom surface of the cavity 14.

Therefore, the exhaust material taken into the cavity 14 from the exhaust material introduction part 44 is trapped in the region from the bottom surface to the exhaust material introduction part 44 in the cavity 14. That is, the region in the cavity 14 functions as a particle trap, and an exhaust material having a large particle size is captured in the region and can be prevented from flowing in advance of the exhaust material outlet 4. Thus, the lifetime of the filter disposed in the exhaust pump can be prolonged.

Although, differing from the above configuration, the installation of the plurality of flow-regulating parts 9 may be omitted, a plurality of flow-regulating parts 9 are disposed in the cavity 14 in the exhaust nozzle N4.

Therefore, the exhaust material having a large particle size can be more reliably prevented from flowing in advance of the exhaust material outlet 4. Thus, the lifetime of the filter disposed in the exhaust pump can be extended.

Further, the mist spray head 100 has a base plate 20 for covering the open ceiling part 58 from the substrate 23 side. Accordingly, even if the exhaust nozzle N4 is disposed separately from the other nozzles N1 to N3, it is possible to prevent the raw material solution or the like from flowing from the reaction space to the open ceiling part 58. Further, it is easy to assemble the exhaust nozzle N4 and the other nozzles N1 to N3 in the mist spray head 100.

Further, a frame 30 of the mist spray head 100 protrudes toward the substrate 23 side. Therefore, the reaction space can be surrounded, and the diffusion of the raw material solution and the like from the reaction space can be suppressed.

Embodiment 2

Figure 6:
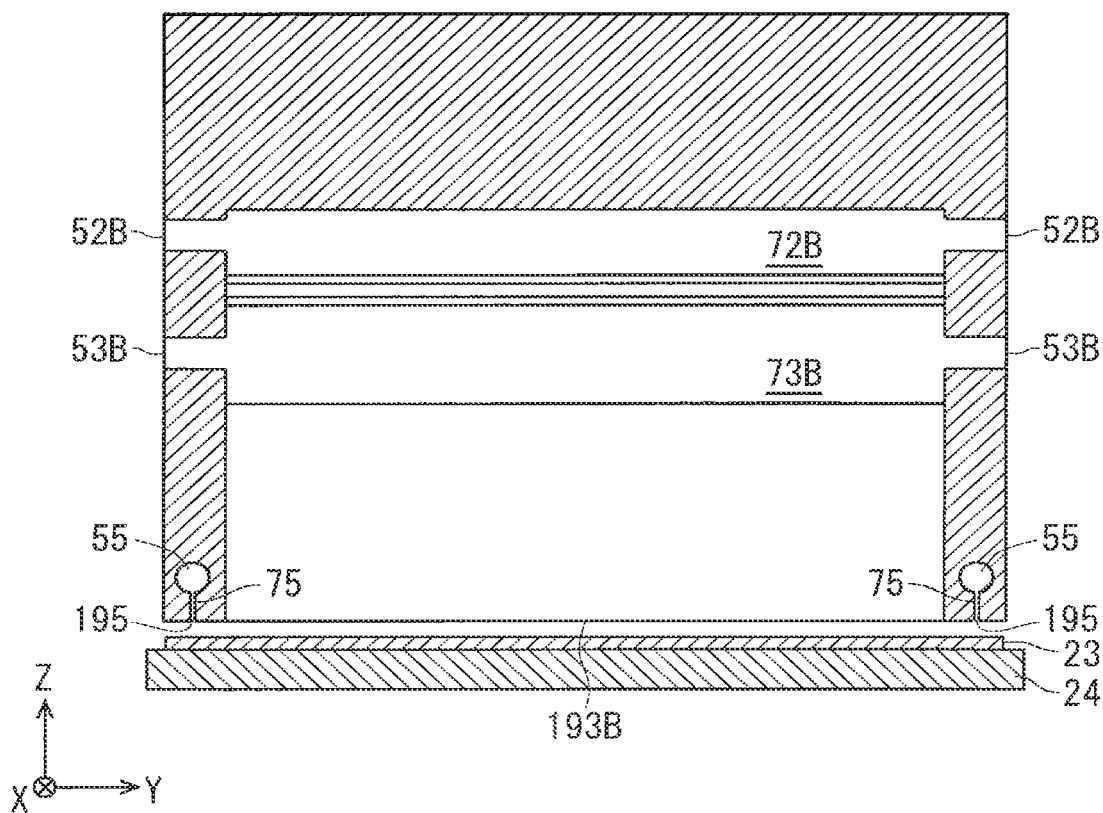
FIG. 6 is a cross sectional view showing a cross sectional structure taken along line C-C of FIG. 5.

FIG. 5 is a cross sectional view showing a configuration of the mist spray head 100B in the film forming device according to Embodiment 2. FIG. 6 is a cross sectional view showing a cross sectional structure taken along line C-C of FIG. 5.

FIG. 7 is a plan view showing a bottom surface structure of the mist spray head 100B. FIGS. 8A and 8B are explanatory views showing the appearance structure and the like of the base plate 20B as viewed from the Y direction. In FIGS. 8A and 8B, FIG. 8A is a side view of the mist spray head 100B as viewed from the left side surface (−X direction), and FIG. 8B is a front view as viewed from the front (+Y direction). The cross sectional structure taken along line D-D of FIG. 8A is a sectional view shown in FIG. 5.

The mist spray head 100 according to Embodiment 1 includes two reaction material spray nozzles N2, N3. On the other hand, in the mist spray head 100B according to Embodiment 2, a configuration is realized in which the reaction material spray nozzle N3B is unified, and the first and second reaction materials are ejected from the reaction material ejection ports 16B and 17B provided in the bottom surface of the reaction material spray nozzle N3B. Furthermore, a configuration is realized in which the atomized raw material solution is ejected from the raw material solution ejection port 15B provided in the bottom surface of the reaction material spray nozzle N3B.

The mist spray head 100 of Embodiment 1 and the mist spray head 100B of Embodiment 2 are mainly different in that the reaction material spray nozzles N2 and N3 are replaced with the reaction material spray nozzle N3B and that the raw material solution spray nozzle N1 is replaced with the raw material solution spray nozzle N1B. In the following description, with respect to the mist spray head 100B of Embodiment 2, the description will focus mainly on the components different from those of the mist spray head 100 of Embodiment 1, and the same components as those in Embodiment 1 are denoted by the same reference numerals, and the explanation will be omitted as appropriate.

As shown in FIG. 5, the mist spray head 100B has the reaction material spray nozzle N3B, the raw material solution spray nozzle N1B, and an exhaust nozzle N4. As shown in FIG. 5, the reaction material spray nozzle N3B, the raw material solution spray nozzle N1B, and the exhaust nozzle N4 are disposed side by side in this order along the X direction (horizontal direction).

Further, the side surface of the raw material solution spray nozzle N1B is in contact with the side surface of the reaction material spray nozzle N3B. However, the side surface of the raw material solution spray nozzle N1B and the side surface of the exhaust nozzle N4 are separated by a predetermined distance. That is, the reaction material spray nozzle N3B and the raw material solution spray nozzle N1B are adjacent to each other in the X direction, and the exhaust nozzle N4 is disposed separately from other nozzles N1B, N3B in the X direction.

As described above, the reaction material spray nozzle N3B, the raw material solution spray nozzle N1B, and the exhaust nozzle N4 are arranged side by side in the X direction (horizontal direction). Here, at least the exhaust nozzle N4 is located at the outermost side (the right end (+X direction) in FIG. 5) of the mist spray head 100B.

The mist spray head 100B sprays the atomized raw material solution or the like to the upper surface of the substrate 23 which is heated at a predetermined temperature by the mounting part 24. Thereby, a desired film is formed on the upper surface of the substrate 23. The mounting part 24 moves in a horizontal direction (in an X-Y plane) at the time of film forming processing. Alternatively, the mist spray head 100B moves in the horizontal direction.

(Raw Material Solution Spray Nozzle N1B and Reaction Material Spray Nozzle N3B)

Hereinafter, configurations of the raw material solution spray nozzle N1B and the reaction material spray nozzle N3B will be described.

The raw material solution spray nozzle N1B is a nozzle for spraying the atomized raw material solution from the raw material solution ejection port 15B formed in the bottom surface of the reaction material spray nozzle N3B. A cavity 11 (one cavity) and a cavity 12B (the other cavity) are formed in the raw material solution spray nozzle N1B. The raw material solution supply part 1 is disposed on the upper surface of the raw material solution spray nozzle N1B as with the raw material solution spray nozzle N1 of Embodiment 1.

In addition, a plurality of flow-regulating parts 6 (first flow-regulating part) are provided on both side surface portions in the cavity 11 of the raw material solution spray nozzle N1B, as with the raw material solution spray nozzle N1 of Embodiment 1.

A cavity 11 is provided below the plurality of flow-regulating parts 6. A small space above the plurality of flow-regulating parts 6 is connected to the cavity 11 through a clearance formed by the plurality of the flow-regulating parts 6, and the cavity 11 is connected to the raw material solution discharge part 41B.

The raw material solution discharge part 41B is provided in one side surface portion (side surface on the left (−X direction) side in FIG. 5) in the cavity 11. Further, the raw material solution discharge part 41B is disposed at a position away from a bottom surface of the raw material solution spray nozzle N1B (cavity 11).

On the other hand, a raw material solution ejection port 15B is formed in the bottom surface of the reaction material spray nozzle portion N3B instead of the raw material solution spray nozzle N1B. That is, in the mist spray head 100B of Embodiment 2, the atomized raw material solution is ejected from the raw material solution ejection port 15B provided in the bottom surface of the reaction material spray nozzle N3B to the upper surface of the substrate 23.

Then, a passage 61B (first internal passage) is provided inside the reaction material spray nozzle N3. The raw material solution discharge part 41B provided in the raw material solution spray nozzle N1B is connected to the raw material solution ejection port 15B via a passage 61B provided in the reaction material spray nozzle N3B.

As shown in FIG. 7, the bottom surface of the mist spray head 100B assumes a rectangular shape defined by the X direction (second direction) and the Y direction (first direction). Then, the raw material solution ejection port 15B assumes a slit shape which is an elongated opening whose longitudinal direction is the Y direction (first direction) in plan view. The width of the opening of the raw material solution ejection port 15B (dimension in the X direction in FIG. 7) is about 0.1 mm to 10 mm.

In the raw material solution spray nozzle N1B, the atomized raw material solution is supplied from the raw material solution supply part 1 to the inside of the cavity 11. Then, the raw material solution is regulated by the plurality of flow-regulating parts 6, fills the small space above the plurality of flow-regulating parts 6, then is guided to the cavity 11, and fills the cavity 11. Thereafter, the atomized raw material solution is guided from the raw material solution discharge part 41B to the raw material solution ejection port 15B via the passage 61B of the reaction material spray nozzle N3B. Then, the atomized raw material solution is ejected from the raw material solution ejection port 15B toward the upper surface of the substrate 23.

Furthermore, the raw material solution spray nozzle N1B has a cavity 12B below the cavity 11, and as shown in FIGS. 5 and 8B, the cavity 12B is connected to a reaction material supply part 2B for supplying a first reaction material contributing to the reaction with the raw material solution, and the cavity 12B is connected to a reaction material discharge part 42B described later.

The reaction material discharge part 42B (first reaction material discharge part) is provided in one side surface portion (side surface on the left (−X direction) side in FIG. 5) in the cavity 12B. Further, the reaction material discharge part 42B is disposed at a position away from a bottom surface of the raw material solution spray nozzle N1B (cavity 12B).

On the other hand, a passage 62B (second internal passage) is provided in the reaction material spray nozzle N3B. Then, the reaction material discharge part 42B provided in the raw material solution spray nozzle N1B is connected to the reaction material ejection port 16B (first reaction material ejection port) provided in the bottom surface of the reaction material spray nozzle N3B via a passage 62B provided in the reaction material spray nozzle N3B.

On the other hand, the reaction material spray nozzle N3B is a nozzle which ejects the second reaction material mainly contributing to the reaction with the raw material solution to the substrate 23. In the reaction material spray nozzle N3B, a single cavity 13B is formed. As shown in FIG. 5, the cavity 13B is provided at an upper portion (in the +Z direction) in the reaction material spray nozzle N3B. Specifically, the cavity 13B is provided on the upper side in the reaction material spray nozzle N3B. Here, the cavity 13B is a space formed independently from other spaces.

As shown in FIG. 5 and FIG. 8B, the reaction material supply part 3B is provided in the side surface in the Y direction in the cavity 13B. The second reaction material is supplied from the outside of the reaction material spray nozzle N3B to the inside of the cavity 13B via the reaction material supply part 3B.

Here, the above-mentioned first and second reaction materials may be gas or liquid. In the case of a liquid, the liquid (reaction material) atomized by using ultrasonic vibration or the like is transported into the raw material solution spray nozzle N1B or the reaction material spray nozzle N3B through a path not shown together with the carrier gas.

The second reaction material output from the reaction material supply part 3B fills (is supplied to) the cavity 13B in the reaction material spray nozzle N3B.

Although not shown in FIG. 5, in the cavity 12B of the raw material solution spray nozzle N1B and in the cavity 13B of the reaction material spray nozzle N3B, a flow-regulating part having a function/action (that is, a function/action of promoting that the flow of the reaction material in the cavities 12B, 13B is regulated, and even if the reaction material and the atmosphere react to produce particles, the particles are trapped in the region from the bottom surface of the cavities 12B, 13B to the reaction material discharge part 42B, 43B) described in Embodiment 1 may be provided.

A reaction material discharge part 43 is provided in the side surface in the X direction in the cavity 13B. Here, the reaction material discharge part 43 is disposed at a position away from a bottom surface of the cavity 13B.

Reaction material ejection ports 16B and 17B are provided in the bottom surface of the reaction material spray nozzle N3B. Here, the first reaction material supplied from the cavity 12B is ejected from the reaction material ejection port 16B to the upper surface of the substrate 23, and the second reaction material supplied from the cavity 13B is ejected from the reaction material ejection port 17B to the upper surface of the substrate 23.

A passage 62B and a passage 63 are provided in the mist spray head 100B (reaction material spray nozzle N3B in the configuration example of FIG. 5). By a neighboring arrangement of the raw material solution spray nozzle N1B and the reaction material spray nozzle N3B, the reaction material discharge part 42B is connected to the reaction material ejection port 16B via the passage 62B. On the other hand, in the reaction material spray nozzle N3B, the reaction material discharge part 43B is connected to the reaction material ejection port 17B via the passage 63.

Further, as shown in FIG. 5, a raw material solution ejection port 15B which ejects the raw material solution to the substrate 23 is provided in the bottom surface of the reaction material spray nozzle N3B. In Embodiment 2, the passage 61B connected between the raw material solution discharge part 41B and the raw material solution ejection port 15B is provided in the reaction material spray nozzle N3B.

Therefore, in the mist spray head 100B of Embodiment 2, the reaction material ejection port 17B, the raw material solution ejection port 15B, and the reaction material ejection port 16B are provided in this order in the X direction (horizontal direction) on the side of the reaction material spray nozzle N3B facing the substrate 23. Here, as shown in FIG. 7, each of reaction material ejection ports 17B, 16B and the raw material solution ejection port 15B assumes a slit shape which is an elongated opening hole whose longitudinal direction is the Y direction in plan view. The widths of the openings of the reaction material ejection ports 17B, 16B and the raw material solution ejection port 15B (dimension in the X direction in FIG. 7) are about 0.1 mm to 10 mm.

The reaction material (first reaction material) discharged from the raw material solution spray nozzle N1B is supplied from the reaction material supply part 2B to the inside of the cavity 12B in the raw material solution spray nozzle N1B. Then, after filling the cavity 12B, the first reaction material is discharged from the reaction material discharge part 42B to the reaction material spray nozzle N3B. Thereafter, the first reaction material is guided to the reaction material ejection port 16B provided in the bottom surface of the reaction material spray nozzle N3B via the passage 62B in the reaction material spray nozzle N3B. Then, the first reaction material is ejected from the reaction material ejection port 16B toward the upper surface of the substrate 23.

On the other hand, the reaction material (second reaction material) is supplied to the inside of the cavity 13B from the reaction material supply part 3B in the reaction material spray nozzle N3B. Then, after filling the cavity 13B, the second reaction material is guided from the reaction material discharge part 43 to the reaction material ejection port 17B via the passage 63.

As shown in FIGS. 5 and 7, the reaction material ejection port 17B, the raw material solution ejection port 15B, the reaction material ejection port 16B, and the exhaust port 18 are arranged in this order in the X direction (horizontal direction).

The exhaust nozzle N4 is disposed separately from the other nozzles N3B, N1B in the X direction. Accordingly, an open ceiling part 58 is generated between the exhaust nozzle N4 and the other nozzles N3B, N1B. Therefore, also in the present embodiment, the mist spray head 100B includes the base plate 20B. The base plate 20B is disposed also from the bottom surface of the reaction material spray nozzle N3B to the bottom surface of the exhaust nozzle N4 so as to cover the open ceiling part 58 from a side where the substrate 23 is disposed (refer to FIG. 5, FIG. 7 and FIG. 8B).

In order to enable to spray the inert gas to the substrate 23, as with Embodiment 1, an inert gas supply part 54, a passage 74, and a plurality of inert gas ejection ports 194 are also provided in the base plate 20B according to the present embodiment. Furthermore, in the base plate 20B of Embodiment 2, as with Embodiment 1, the temperature adjustment mechanism 22 is disposed.

In Embodiment 2, the temperature adjustment mechanism 22 is also disposed in the reaction material spray nozzle N3B. In addition, in the mist spray head 100B, temperature adjustment of the raw material solution spray nozzle N1B is performed by a part of the temperature adjustment mechanism 22 disposed in the base plate 20B.

In addition, also in Embodiment 2, the mist spray head 100B has a frame 30 on a side (bottom surface) facing the substrate 23. Further, as shown in FIG. 5, as with Embodiment 1, also in Embodiment 2, the inert gas supply part 51, the passage 71, and the inert gas ejection port 191 of the inert gas spray part 81, an inert gas supply part 55, a passage 75, and an inert gas ejection port 195 are provided in the mist spray head 100B.

When the atomized raw material solution and reaction material are sprayed into the reaction space, the raw material solution and the reaction material react on the heated substrate 23, and a desired film is formed on the upper surface of the substrate 23. The reaction residues and the like in the reaction space are excluded from the reaction space by the exhaust nozzle N4.

(Inert Gas Ejection Ports 192B and 193B, Etc.)

As with Embodiment 1, the inert gas spray part 81 is provided in the frame 30 or in a region adjacent to the frame 30 at the end of the mist spray head 100B of Embodiment 2 (end on the −X direction side in FIG. 5). Further, inert gas spray parts 82B and 83B are formed inside the reaction material spray nozzle N3B of the mist spray head 100B.

The inert gas spray part 81 is mainly composed of an inert gas supply part 51, a passage 71, and an inert gas ejection port 191. The inert gas spray part 82B is mainly composed of an inert gas supply part 52B, a passage 72B, and an inert gas ejection port 192B. The inert gas spray part 83B is mainly composed of an inert gas supply part 53B, a passage 73B, and an inert gas ejection port 193B.

As shown in FIG. 5, the inert gas spray part 82B is provided below the cavity 13B in the reaction material spray nozzle N3B, and the main part (passage 73B around the inert gas supply part 53B) of the inert gas spray part 83B is formed below the main part (the passage 72B around the inert gas supply part 52B) of the inert gas spray part 82B. Here, the inert gas spray parts 82B and 83B are spaces formed independently from other spaces.

As shown in FIGS. 5, 6 and FIG. 8B, inert gas supply parts 52B and 53B are provided in the side surface in the Y direction in the inert gas spray parts 82B and 83B. The inert gas supply parts 52B and 53B are connected to the inert gas ejection ports 192B and 193B formed in the bottom surface of the reaction material spray nozzle N3B through the passages 72B and 73B formed in the reaction material spray nozzle N3B.

As shown in FIG. 5 and FIG. 6, in the inert gas spray parts 82B and 83B, the inert gas introduced from the outside into the inert gas supply parts 52B and 53B is guided to the inert gas ejection ports 192B and 193B, respectively, formed in the bottom surface of the mist spray head 100B through the passages 72B and 73B, and are ejected from the inert gas ejection ports 192B and 193B.

The inert gas supply parts 51, 52B and 53B communicate with the inert gas ejection ports 191, 192B and 193B, respectively, but the opening area of each of the inert gas supply parts 51, 52B and 53B is desirably set to an area equal to or greater than the opening area of each of the inert gas ejection ports 191, 192B and 193B.

Furthermore, it is desired that the flow rate at which each of the inert gas ejection ports 191, 192B and 193B ejects the inert gas is set to each of a flow rate at which the raw material solution ejection port 15B ejects the raw material solution and flow rates at which the reaction material ejection ports 16B and 17B eject the reaction material or less.

Furthermore, as shown in FIG. 6, as with Embodiment 1, the inert gas introduced into the two inert gas supply parts 55 provided at both ends in the Y direction flows through the passages 75, and is ejected from two inert gas ejection ports 195 formed in the bottom surface of the mist spray head 100B as shown in FIG. 7.

As described above, the inert gas ejection port 195 is provided in the frame 30 or in the region adjacent to the frame 30 described above.

With the above-described configuration, the inert gas sent from the outside of the mist spray head 100B through the inert gas supply parts 51, 52B and 53B of the inert gas spray parts 81, 82B and 83B and the inert gas supply part 55 is supplied into the mist spray head 100B. The passages 71, 72B and 73B and the passage 75 are provided in the mist spray head 100B, and the supplied inert gas propagates through the passages 71, 72B and 73B and the passage 75. The inert gas ejection ports 191, 192B and 193B, and the inert gas ejection port 195 are provided in the bottom surface (side facing the substrate 23) of the mist spray head 100B, and the inert gas is sprayed from the inert gas ejection ports 191, 192B and 193B, and the inert gas ejection port 195 toward the upper surface of the substrate 23.

The exhaust nozzle N4 is disposed separately from the other nozzles N1B and N3B in the X direction. Accordingly, an open ceiling part 58 is generated between the exhaust nozzle N4 and the other nozzles N1B and N3B. Thus, the mist spray head 100B includes the base plate 20B. The base plate 20B covers the open ceiling part 58 from a side where the substrate 23 is disposed (refer to FIG. 5, FIG. 7 and FIG. 8B).

As shown in FIG. 5, FIG. 7 and FIG. 8B, the inert gas supply part 54 (refer to FIG. 8B), the passage 74 (refer to FIG. 5, FIG. 7), and the plurality of inert gas ejection ports 194 are provided in the base plate 20B of the mist spray head 100B of Embodiment 2.

In the base plate 20B, the inert gas sent from the outside of the mist spray head 100B via the inert gas supply parts 54 is supplied to the base plate 20B. The passage 74 is provided in the base plate 20B, and the supplied inert gas propagates through the passage 74. The plurality of inert gas ejection ports 194 are provided in the bottom surface (side facing the substrate 23) of the base plate 20B, and the inert gas is sprayed from the plurality of inert gas ejection ports 194 toward the upper surface of the substrate 23.

As shown in FIG. 7, the inert gas ejection ports 191 to 194 (191, 192B, 193B, and 194) each have a slit shape which is an elongated opening hole whose longitudinal direction is the Y direction (first direction) in plan view. On the other hand, the inert gas ejection port 195 has a slit shape which is an elongated opening hole whose longitudinal direction is the X direction (second direction) in plan view. The width of the opening of each of the inert gas ejection ports 191 to 195 (the dimension in the X direction in FIG. 7 with the inert gas ejection ports 191 to 194, and the dimension in the Y direction in FIG. 7 with the inert gas ejection port 195) is about 0.1 mm to 10 mm.

As shown in FIGS. 5 and 7, in the bottom surface of the reaction material spray nozzle N3B, the inert gas ejection port 192B is provided between the raw material solution ejection port 15B and the reaction material ejection port 17B, and the inert gas ejection port 193B is provided between the raw material solution ejection port 15B and the reaction material ejection port 16B. That is, in the bottom surface of the mist spray head 100B of Embodiment 2, it is characterized that the inert gas ejection ports 192B and 193B are provided between the raw material solution ejection port 15B and the reaction material ejection ports 16B and 17, respectively.

Further, in the mist spray head 100B of Embodiment 2, the bottom surface of the reaction material spray nozzle N3B and the bottom surface of the base plate 20B are configured so as to be flush. Accordingly, the raw material solution ejection port 15B, the reaction material ejection ports 16B and 17B, and the inert gas ejection ports 192B, 193B and 194 are provided in a flush bottom surface of the mist spray head 100B.

(Effect Etc.)

In the mist spray head 100B of Embodiment 2, the raw material solution spray nozzle N1B has the raw material solution discharge parts 41B and 42B which can discharge the atomized raw material solution and the first reaction material (reaction material supplied from the reaction material supply part 2B) to the reaction material spray nozzle N3B.

On the other hand, the reaction material spray nozzle N3B ejects inert gas from the inert gas ejection ports 193B and 192B (first and second inert gas ejection ports), respectively, and ejects a second reaction material (reaction material supplied from the reaction material supply part 3B) from the reaction material ejection port 17B (second reaction material ejection port).

Further, the reaction material spray nozzle N3B has the passages 61B and 62B (first and second internal passages) therein which guide the raw material solution and the first reaction material discharged from the raw material solution discharge parts 41B and 42B of the raw material solution spray nozzle N1B to the raw material solution ejection port 15B and the reaction material ejection port 16B (first reaction material ejection port).

The mist spray head 100B of Embodiment 2 having the above configuration is characterized in that by combined configuration of the raw material solution spray nozzle N1B and the reaction material spray nozzle N3B, the inert gas ejection ports 193B and 192B are provided between the raw material solution ejection port 15B and the reaction material ejection ports 16B and 17B, respectively.

Therefore, in the film forming device of Embodiment 2, as with Embodiment 1, it is possible to reduce the adhesion of reaction products to each of the vicinity of the raw material solution ejection port 15B and vicinities of the reaction material ejection ports 16B and 17B. As a result, the film forming device of Embodiment 2 achieves the effect that clogging of the raw material solution ejection port 15B and the reaction material ejection ports 16B and 17B, respectively, can be reliably avoided.

Further, the ejection ports 15B to 17B, and the inert gas ejection ports 191 to 194 respectively formed in the bottom surface of the mist spray head 100B of Embodiment 2 are formed in a slit shape in which a first direction (Y direction) is a longitudinal direction. Therefore, it is possible to evenly spray the atomized raw material solution to the large-area substrate.

Further, the mounting part 24 or the mist spray head 100B is movable in the horizontal direction. Therefore, the film forming processing using the film forming device (mist spray head 100B) according to the present embodiment can be performed on an entire surface of the substrate 23 having the large surface area.

Further, by forming the reaction material ejection port 16B (17B) in a slit shape, the reaction material can be sprayed evenly to the upper surface of the large-area substrate 23.

In addition, by forming the exhaust port 18 in a slit shape, the exhaust processing can be performed over a wider range. Further, it is possible to equalize the flow in the X direction in which the raw material solution or the like flows toward the exhaust port 18.

Further, in the film forming device of Embodiment 2, by setting the opening area of each of the inert gas supply parts 51, 52B and 53B to an area equal to or greater than the opening area of each of the inert gas ejection ports 191, 192B and 193B, that is, by setting the opening area of each of the inert gas ejection ports 191, 192B and 193B to an area equal to or less than the opening area of each of the inert gas supply parts 51, 52B and 53B, the effect that a pressure difference can be set between the inert gas ejection ports 191, 192B and 193B and the inert gas supply parts 51, 52B and 53B, and the inert gas can be uniformly spread over the upper surface of the substrate 23 at the time of film formation, is achieved.

In addition, in the film forming device of Embodiment 2, the flow rate at which each of the inert gas ejection ports 191, 192B and 193B ejects the inert gas is set to each of a flow rate at which the raw material solution ejection port 15B ejects the raw material solution and flow rates at which the reaction material ejection ports 16B and 17B eject the reaction material or less.

Therefore, the film forming device of Embodiment 2 can suppress the phenomenon of impairing the reaction between the raw material solution and the reaction material by ejecting the inert gas.

Furthermore, the film forming device of Embodiment 2 achieves the same effects as in the film forming device of Embodiment 1 and achieves the following effects.

In the mist spray head 100B according to Embodiment 2, two cavities 11 and 12B are provided in one raw material solution spray nozzle N1B, and two type of reaction materials and two inert gases are sprayed from one reaction material spray nozzle N3B toward the substrate 23.

Accordingly, in the case of spraying two types of reaction materials, it is not necessary to provide two reaction material spray nozzles N2 and N3 in the mist spray head 100B as described in Embodiment 1. That is, it is possible to save space in the mist spray head 100B according to Embodiment 2.

Furthermore, in the mist spray head 100B according to Embodiment 2, since the inert gas spray parts 82B and 83B are provided in one reaction material spray nozzle N3B, it becomes unnecessary to independently provide the inert gas spray parts 82 and 83 as distinct from the mist spray head 100 of Embodiment 1, so that it is possible to save space in the mist spray head 100B.

In addition, as with Embodiment 1, the mist spray head 100B has a base plate 20B for covering the open ceiling part 58 from the substrate 23 side. Accordingly, even if the exhaust nozzle N4 is disposed separately from the other nozzles N1B to N3B, it is possible to prevent the raw material solution or the like from flowing from the reaction space to the open ceiling part 58. Further, it is easy to assemble the exhaust nozzle N4 and the other nozzles N1B and N3B in the mist spray head 100B.

<Others>

In the above-described embodiment, the configuration is described in which the first and second reaction materials are ejected from the reaction material ejection ports 16 and 17 (16B and 17B) to the substrate 23, but a configuration may be employed in which a single reaction material is ejected from a single reaction material ejection port. In this case, it is possible to exert the effect that when a single inert gas ejection port (inert gas ejection port corresponding the inert gas ejection ports 192 and 193 (192B and 193B)) is provided between the raw material solution ejection port 15 (15B) and the single reaction material ejection port, clogging of each of the raw material solution ejection port 15 (15B) and the single reaction material ejection port can be surely avoided.

While this invention has been described in detail, the foregoing description is in all aspects illustrative and the invention is not limited thereto. It is understood that innumerable modifications not illustrated can be envisaged without departing from the scope of the present invention.

The invention claimed is:

1. A film forming device which forms a film on a substrate by spraying an atomized raw material solution to an atmosphere, the film forming device comprising:
   a mounting part on which said substrate is mounted; and
   a mist spray head having a raw material solution ejection port, a reaction material ejection port, and an inert gas ejection port at a bottom surface of said mist spray head, the bottom surface of said mist spray head having a flush bottom surface, said mist spray head sprays, to said substrate mounted on said mounting part, said raw material solution from said raw material solution ejection port through a raw material solution passage extending, in a predetermined direction, a reaction material contributing to a reaction with said raw material solution from said reaction material ejection port through a reaction material passage extending in said predetermined direction, and an inert gas from said inert gas ejection port, wherein
   said inert gas ejection port is provided between said raw material solution ejection port and said reaction material ejection port.

2. The film forming device according to claim 1, wherein
   said inert gas ejection port includes first and second inert gas ejection ports,
   said reaction material includes first and second reaction materials, said reaction material ejection port includes first and second reaction material ejection ports for ejecting said first and second reaction materials, and said first inert gas ejection port is provided between said raw material solution ejection port and said first reaction material ejection port, and said second inert gas ejection port is provided between said raw material solution ejection port and said second reaction material ejection port.

3. The film forming device according to claim 2, wherein said mist spray head includes:
- a raw material solution spray nozzle for spraying said raw material solution from said raw material solution ejection port provided in the bottom surface;
- first and second reaction material spray nozzles which are located across said raw material solution spray nozzle and spray said first and second reaction materials from said first and second reaction material ejection ports provided in the bottom surface; and
- first and second inert gas spray parts for spraying inert gas from said first and second inert gas ejection ports provided in the bottom surface, and
- the first inert gas spray part being provided between said raw material solution spray nozzle and said first reaction material spray nozzle, and said second inert gas spray part being provided between said raw material solution spray nozzle and said second reaction material spray nozzle.

4. The film forming device according to claim 2, wherein said mist spray head comprises:

a raw material solution spray nozzle for spraying said first reaction material in addition to the spraying of said raw material solution; and a reaction material spray nozzle which is provided adjacent to said raw material solution spray nozzle and has said raw material solution ejection port, said first and second reaction material ejection ports and said first and second inert gas ejection ports in the bottom surface, and said raw material solution spray nozzle including a raw material solution discharge part and a first reaction material discharge part which can discharge said raw material solution and said first reaction material to said reaction material spray nozzle, and said reaction material spray nozzle which ejects an inert gas from said first and second inert gas ejection ports, respectively, ejects said second reaction material from said second reaction material ejection port, and has first and second internal passages which guide said raw material solution and said first reaction material discharged from said raw material solution discharge part and said first reaction material discharge part, respectively, of said raw material solution spray nozzle to said raw solution ejection port and said first reaction material ejection port.

5. The film forming device according to claim 1, wherein the bottom surface of said mist spray head assumes a rectangular shape defined by first and second directions, and said raw material solution ejection port, said reaction material ejection port, and said inert gas ejection port are each formed in a slit shape in which said first direction is a longitudinal direction in a plan view.

6. The film forming device according to claim 1, wherein said mist spray head further includes an inert gas supply part which introduces an inert gas from an outside of said mist spray head, and said inert gas supply part communicates with said inert gas ejection port, and an opening area of said inert gas ejection port is equal to or less than another opening area of said inert gas supply part.

7. The film forming device according to claim 1, wherein a first flow rate of said inert gas ejected is equal to or less than each of a second flow rate of said raw material solution ejected and a third flow rate of said reaction material ejected.

8. The film forming device according to claim 1, wherein said mist spray head includes a raw material solution spray nozzle for spraying said raw material solution from said raw material solution ejection port, and said raw material solution spray nozzle includes:
- a first cavity;
- a raw material solution supply part which supplies said raw material solution which is atomized into said first cavity;
- a raw material solution discharge part which is provided in a first side surface in said first cavity at a position apart from the bottom surface of said first cavity and is connected to said raw material solution ejection port; and
- a first flow-regulating part which is provided in said first cavity and regulates the flow of said raw material solution.

9. The film forming device according to claim 8, wherein said mist spray head further includes a reaction material spray nozzle which is arranged along a direction which is horizontal to said raw material solution spray nozzle and sprays said reaction material.

10. The film forming device according to claim 9, wherein said reaction material spray nozzle includes:
- second cavities;
- reaction material supply parts for supplying said reaction material to an inside of said second cavities; and
- reaction material discharge parts which are provided in second side surfaces in said second cavities at positions apart from the bottom surfaces of said second cavities and are connected to said reaction material ejection port.

11. The film forming device according to claim 10, wherein said mist spray head further includes an exhaust nozzle for performing an exhaust processing from an exhaust port, and said exhaust nozzle performs said exhaust processing at a first flow rate equal to or greater than a sum of a second flow rate at which said raw material solution spray nozzle ejects said raw material solution and a third flow rate at which said reaction material spray nozzle ejects said reaction material.

12. The film forming device according to claim 11, wherein said exhaust nozzle includes:
- a third cavity;
- an exhaust material introduction part which is provided in a third side surface in said third cavity at a position apart from the bottom surface of said third cavity and is connected to said exhaust port; and an exhaust material outlet which is provided above said exhaust material introduction part and discharges the exhaust material from said third cavity to an outside of said exhaust nozzle.

13. The film forming device according to claim 11, wherein said mist spray head further includes:
   an open ceiling part provided between said raw material solution spray nozzle and said exhaust nozzle; and
   a base plate for covering said open ceiling part from a side where said substrate is disposed.

14. The film forming device according to claim 13, wherein a third inert gas ejection port for ejecting an inert gas is provided in said base plate.

15. The film forming device according to claim 11, wherein
said raw material solution spray nozzle, said reaction material spray nozzle, and said exhaust nozzle are arranged side by side in a horizontal direction, and
at least said exhaust nozzle is located at the outermost side of said mist spray head.

\* \* \* \* \*